(12) United States Patent
Nentwig et al.

(10) Patent No.: US 9,209,845 B2
(45) Date of Patent: Dec. 8, 2015

(54) CALIBRATION

(71) Applicant: Broadcom Corporation, Irvine, CA (US)

(72) Inventors: Markus Rudiger Nentwig, Helsinki (FI); Jouni Kristian Kaukovuori, Vantaa (FI)

(73) Assignee: BROADCOM CORPORATION, Irvine, CA (US)

( * ) Notice: Subject to any disclaimer, the term of this patent is extended or adjusted under 35 U.S.C. 154(b) by 27 days.

(21) Appl. No.: 14/103,936

(22) Filed: Dec. 12, 2013

(65) Prior Publication Data

US 2014/0171007 A1    Jun. 19, 2014

(30) Foreign Application Priority Data

Dec. 14, 2012 (GB) .................................. 1222644.5

(51) Int. Cl.
*H04B 1/26* (2006.01)
*H04B 1/10* (2006.01)

(52) U.S. Cl.
CPC ....................................... *H04B 1/10* (2013.01)

(58) Field of Classification Search
CPC ..... H03D 7/1441; H03D 7/00; H03D 7/1433; H03D 7/02; H04B 1/30; H04B 1/28; H04B 15/06
USPC ................. 455/75, 76, 77, 230, 232.1, 234.1, 455/255–260, 313, 323, 334
See application file for complete search history.

(56) References Cited

U.S. PATENT DOCUMENTS

| | | | |
|---|---|---|---|
| 7,177,617 B2* | 2/2007 | Kerth et al. | 455/302 |
| 8,699,631 B2* | 4/2014 | Kravets | 375/340 |
| 8,909,183 B2* | 12/2014 | Morita | 455/234.2 |
| 2006/0009171 A1 | 1/2006 | Xu et al. | |
| 2011/0076961 A1 | 3/2011 | Feng et al. | |

FOREIGN PATENT DOCUMENTS

GB    2480374    11/2011

* cited by examiner

*Primary Examiner* — Nhan Le
(74) *Attorney, Agent, or Firm* — Oblon, McClelland, Maier & Neustadt, L.L.P.

(57) ABSTRACT

Technique for calibration of a frequency converter for reducing a leakage-based non-direct-current component at an output of the frequency converter. In an apparatus comprising a frequency converter arranged to perform frequency conversion on an input signal, a local oscillator signal generator arranged to generate an amplitude-modulated local oscillator signal of the frequency converter, and a detector arranged to detect a non-direct-current component of an output signal of the frequency converter, which results from the amplitude-modulated local oscillator signal, an amplitude modulation of an original local oscillator signal by the local oscillator signal generator is controlled, a magnitude of local oscillator leakage of the frequency converter is observed on the basis of the non-direct-current component detected by the detector, and at least one parameter influencing the non-direct-current component of the output signal of the frequency converter is adjusted such that the observed magnitude of local oscillator leakage is reduced.

20 Claims, 11 Drawing Sheets

CALIBRATION

TECHNICAL FIELD

The present invention relates to leakage calibration for a frequency converter. In particular, but not exclusively, the present invention relates to measures (including methods, apparatuses and computer program products) for calibration of a frequency converter for reducing local oscillator leakage of the frequency converter.

BACKGROUND

In receivers of communication terminal equipment, such as radio receivers for cellular handsets, a frequency conversion is performed to convert a radio frequency (RF) signal into a baseband (BB) or intermediate frequency (IF) signal. Such frequency conversion is typically accomplished by mixing an input signal, which is input from a signal source, with a local oscillator (LO) signal. This basic principle is applied in different types of receiver architectures such as e.g. direct conversion and mixer-first (LNA-less) receiver architectures.

FIG. 1 shows a schematic diagram of an exemplary topology of a direct-conversion receiver architecture.

As is evident from FIG. 1, a received radio signal is preselected by a pre-select (band-pass) filter, and the thus preselected radio signal is amplified in a low-noise amplifier (LNA) before being down-converted. The down-conversion may be performed with two down-conversion mixers (MIX) controlled by a local oscillator (LO) signal, which is divided into an in-phase LO signal and a quadrature LO signal with 90° phase shift, to prevent signal sidebands from aliasing on one another. In each receive path, prior to analog-to-digital conversion by an analog-to-digital converter (ADC), the signal is low-pass filtered by a low-pass filter (LP) and amplified by an amplifier (AMP) such that the signal level for the ADC is at a sufficient level.

FIG. 2 shows a schematic diagram of an exemplary topology of a mixer-first (LNA-less) receiver architecture.

As is evident from FIG. 2, there is no active amplifier, such as the LNA in FIG. 1, between a pre-select (band-pass) filter and a further processing of the thus preselected radio signal. Otherwise, the topology of FIG. 2 corresponds to that of FIG. 1, and the processing in each receive path is basically similar to that described above in connection with FIG. 1.

In both receiver architectures described above, there is a problem in that the LO signal could leak through the mixers (which could be assigned to a frequency converter), i.e. that LO leakage signal components could appear at the input. If so, corresponding LO leakage signal components would result in DC components in an output signal of the frequency converter which are not based on static DC offsets or second-order linearity (IIP2) effects but on self-mixing effects. These can however not be distinguished from DC components caused by other effects, such as temperature-dependent static DC offset or even-order nonlinearity effects, for example.

While this problem is also present in a direct-conversion receiver architecture, it is even more relevant in a mixer-first (LNA-less) receiver architecture. This is due to the lack of an amplifier such as a LNA at the receiver input, which leads to the lack of reverse isolation for LO leakage towards the antenna, and also the lack of an active amplification stage to increase the level of the wanted signal at the mixer.

One specific problem caused by LO leakage to a receiver input is that the LO signal contains phase noise that appears as additive noise at the receiver input and deteriorates the noise figure of the receiver. FIG. 3 shows a graph illustrating a receiver noise figure over LO leakage in a mixer-first (LNA-less) receiver architecture.

As is evident from FIG. 3, the deterioration of a receiver noise figure from leaked LO phase noise becomes worse with decreasing receiver bandwidth. For the LTE bandwidth modes 1.4, 3, 5, 10, 15 and 20 MHz, the receiver noise figure at every LO leakage is larger in this sequence. For example, the curve for the LTE 5 MHz mode, i.e. the third curve from the top, shows that LO leakage of −68 dBm at the input of a RFIC, which has a noise figure of 2.5 dB in the absence of LO leakage, will increase that noise figure to 5 dB.

Accordingly, narrow-band modes appear to be more sensitive to LO leakage (or phase noise), as most of the phase noise spectrum is confined in a bandwidth even smaller than 1.4 MHz. In other words, the absolute phase noise contributed to the LTE 1.4 MHz mode is essentially the same as for the LTE 20 MHz mode, regardless of the difference in receiver bandwidth, but the relative phase noise becomes larger with decreasing receiver bandwidth.

While calibration of a frequency converter (or its mixers) could reduce LO leakage and thus the resulting DC components, a receiver cannot directly sense its own LO leakage, as it converts to 0 Hz at baseband and appears in combination with DC offsets from other sources. Therefore, no such accurate calibration is feasible, but only "symptoms" of the LO leakage, i.e. resulting effects, can be observed, and a calibration can be based on adding the observed "symptoms" with opposite sign, resulting in an inaccurate calibration.

Accordingly, techniques of leakage calibration for a frequency converter are required for reducing local oscillator leakage of the frequency converter.

SUMMARY

Various embodiments of the present invention aim at addressing at least part of the above issues and/or problems and drawbacks. Various aspects of embodiments of the present invention are set out in the appended claims.

According to a first aspect of the present invention, there is provided apparatus for use at a radio receiver, the apparatus comprising:

a frequency converter arranged to perform frequency conversion on an input signal;

a local oscillator signal generator arranged to generate an amplitude-modulated local oscillator signal of the frequency converter;

a detector arranged to detect a non-direct-current component of an output signal of the frequency converter, which results from the amplitude-modulated local oscillator signal; and a controller arranged to:
control an amplitude modulation of an original local oscillator signal by the local oscillator signal generator,
observe a magnitude of local oscillator leakage of the frequency converter on the basis of the non-direct-current component detected by the detector, and
adjust at least one parameter influencing the non-direct-current component of the output signal of the frequency converter such that the observed magnitude of local oscillator leakage is reduced.

The apparatus according to the aforementioned aspect of the present invention may comprise at least one processor and at least one memory, which may represent a processing system with corresponding functionality as explained herein. Such processing system may for example comprise at least one processor and at least one memory including computer program code (and, optionally, at least one transceiver or interface configured for communication with at least another apparatus), wherein the at least one processor, with the at least one memory and the computer program code, is arranged/configured to cause the apparatus to perform as described herein.

According to a second aspect of the present invention, there is provided a method for controlling an apparatus comprising a frequency converter arranged to perform frequency conversion on an input signal, a local oscillator signal generator arranged to generate an amplitude-modulated local oscillator signal of the frequency converter, and a detector arranged to detect a non-direct-current component of an output signal of the frequency converter, which results from the amplitude-modulated local oscillator signal, the method comprising:

controlling an amplitude modulation of an original local oscillator signal by the local oscillator signal generator;

observing a magnitude of local oscillator leakage of the frequency converter on the basis of the non-direct-current component detected by the detector; and adjusting at least one parameter influencing the non-direct-current component of the output signal of the frequency converter such that the observed magnitude of local oscillator leakage is reduced.

According to a third aspect of the present invention, there is provided an apparatus for use at a radio receiver, the apparatus comprising:

frequency conversion means for performing frequency conversion on an input signal;

local oscillator signal generating means for generating an amplitude-modulated local oscillator signal of the frequency converter;

detecting means for detecting a non-direct-current component of an output signal of the frequency converter, which results from the amplitude-modulated local oscillator signal;

means for controlling an amplitude modulation of an original local oscillator signal by the local oscillator signal generator;

means for observing a magnitude of local oscillator leakage of the frequency converter on the basis of the non-direct-current component detected by the detector; and means for adjusting at least one parameter influencing the non-direct-current component of the output signal of the frequency converter such that the observed magnitude of local oscillator leakage is reduced.

According to a fourth aspect of the present invention, there is provided a computer program product comprising computer-executable computer program code which, when executed on a computerised device, is configured to cause the computerised device to carry out a method according to the aforementioned method-related aspect of the present invention.

Such computer program product may for example comprise or be embodied as a (tangible) computer-readable (storage) medium or the like on which the computer-executable computer program code is stored, and/or the program may be directly loadable into an internal memory of the computer or a processor thereof.

According to a fifth aspect of the present invention, there is provided a method substantially in accordance with any of the examples as described herein with reference to and illustrated by the accompanying drawings.

According to a sixth aspect of the present invention, there is provided apparatus substantially in accordance with any of the examples as described herein with reference to and illustrated by the accompanying drawings.

Advantageous further developments or modifications of the aforementioned exemplary aspects of the present invention are set out in the following.

By virtue of any one of the aforementioned example aspects of the present invention, there is provided a technique for calibration of a frequency converter for reducing local oscillator leakage of the frequency converter.

Thus, by way of embodiments of the present invention, enhancements and/or improvements are achieved in terms of leakage calibration for a frequency converter.

Further features and advantages of the invention will become apparent from the following description of preferred embodiments of the invention, given by way of example only, which is made with reference to the accompanying drawings.

DETAILED DESCRIPTION

Example aspects of the present invention will be described herein. More specifically, example aspects of the present are described hereinafter with reference to particular non-limiting examples. A person skilled in the art will appreciate that the invention is by no means limited to these examples, and may be more broadly applied.

It is to be noted that the following description of the present invention and its embodiments mainly refers to explanations being used as non-limiting examples for exemplifying purposes. As such, the description of embodiments given herein specifically refers to terminology which is related thereto. Such terminology is only used in the context of the presented non-limiting examples, and does naturally not limit the invention in any way.

In particular, the present invention and its embodiments may be applicable to any (kind of) radio receiver operable in any (kind of) application areas. Such application areas may for example involve any radio systems, radio communication systems as well as radar and satellite systems. For example, the present invention and its embodiments may be applicable to operate with 3GPP cellular systems, as well as other radio systems, such as positioning systems (e.g. GPS, GLONASS, Galileo, etc.), connectivity radio systems, such as WLAN and/or Bluetooth, measurement systems, theft alarm systems, or the like.

Hereinafter, various embodiments and implementations of the present invention and its aspects or embodiments are described using several alternatives. It is generally noted that, according to certain needs and constraints, all of the described alternatives may be provided alone or in any conceivable combination (also including combinations of individual features of the various alternatives).

According to embodiments of the present invention, in general terms, there are provided measures of a technique for calibration of a frequency converter for reducing a local oscillator leakage of the frequency converter.

Figure 4:
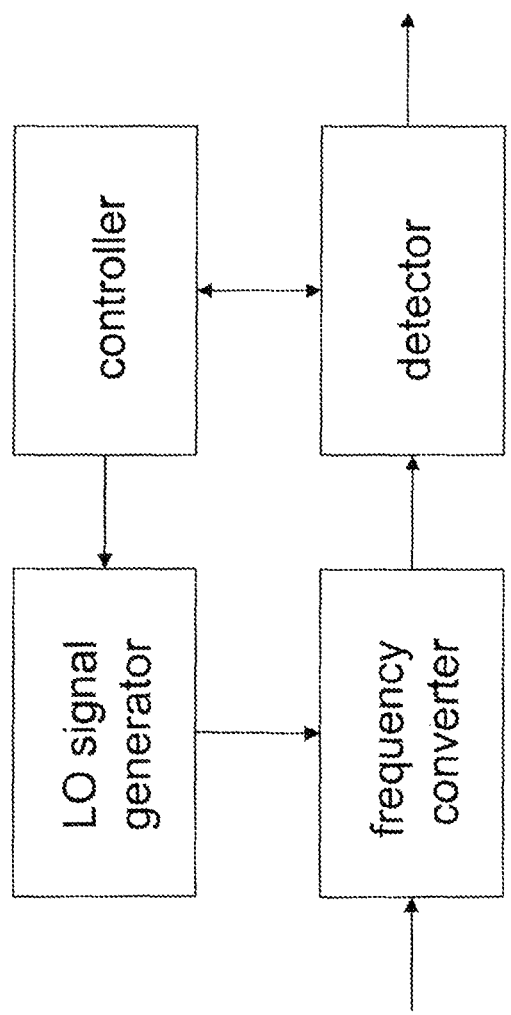
FIG. 4 shows a schematic block diagram illustrating an apparatus according to embodiments of the present invention.

FIG. 4 shows a schematic block diagram illustrating an apparatus according to embodiments of the present invention.

As shown in FIG. 4, an apparatus according to embodiments of the present invention comprises a frequency converter arranged to perform frequency conversion on an input signal (coming from a signal source, which could e.g. comprise an antenna, a duplexer, balun, a RF filter or the like), a local oscillator (LO) signal generator arranged to generate an amplitude-modulated local oscillator signal of the frequency converter, a detector arranged to detect a non-direct-current component of an output signal of the frequency converter, which results from the amplitude-modulated local oscillator signal, and a controller arranged to control the LO signal generator and the detector and to obtain the detected non-direct-current (non-DC) components from the detector.

As explained below, the controller is arranged to control an amplitude modulation of an original local oscillator signal by the LO signal generator, observe (or estimate) a magnitude of local oscillator (LO) leakage on the basis of the non-DC component detected by the detector, and adjust at least one parameter influencing the non-DC component of the output signal of the frequency converter such that the observed (or estimated) magnitude of local oscillator (LO) leakage is reduced.

Figure 1:
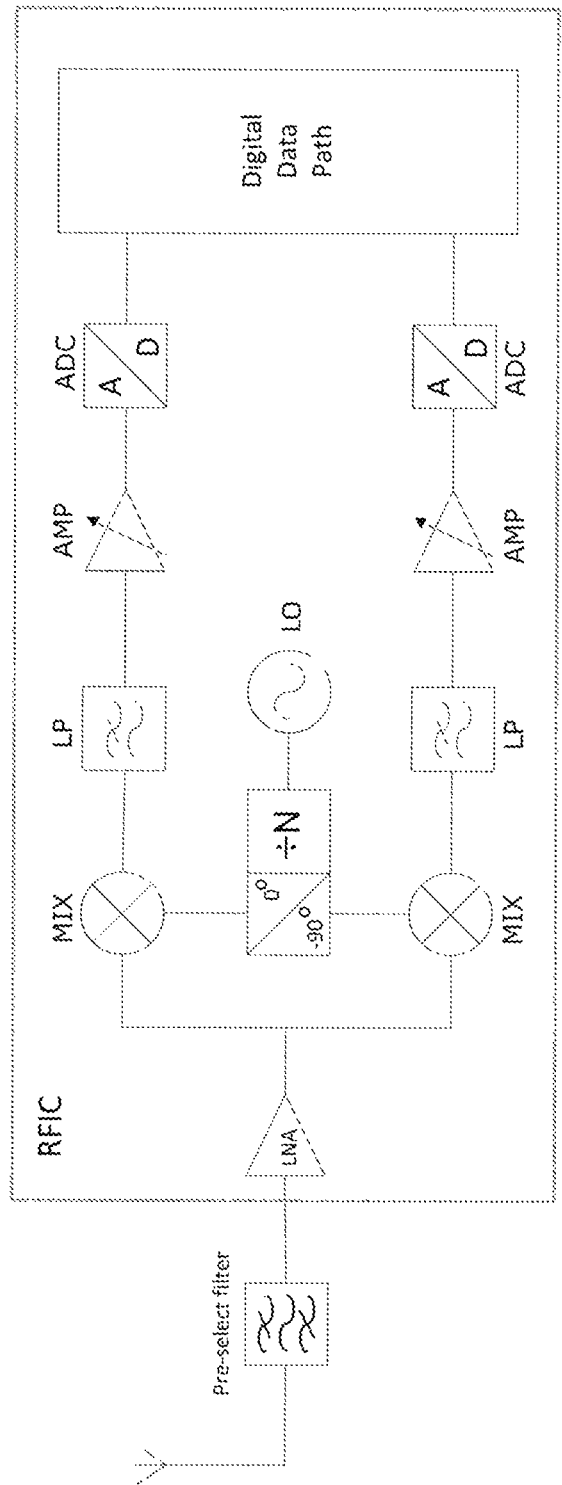
FIG. 1 shows a schematic diagram of an example topology of a direct-conversion receiver architecture, for which embodiments of the present invention are applicable.
Figure 2:
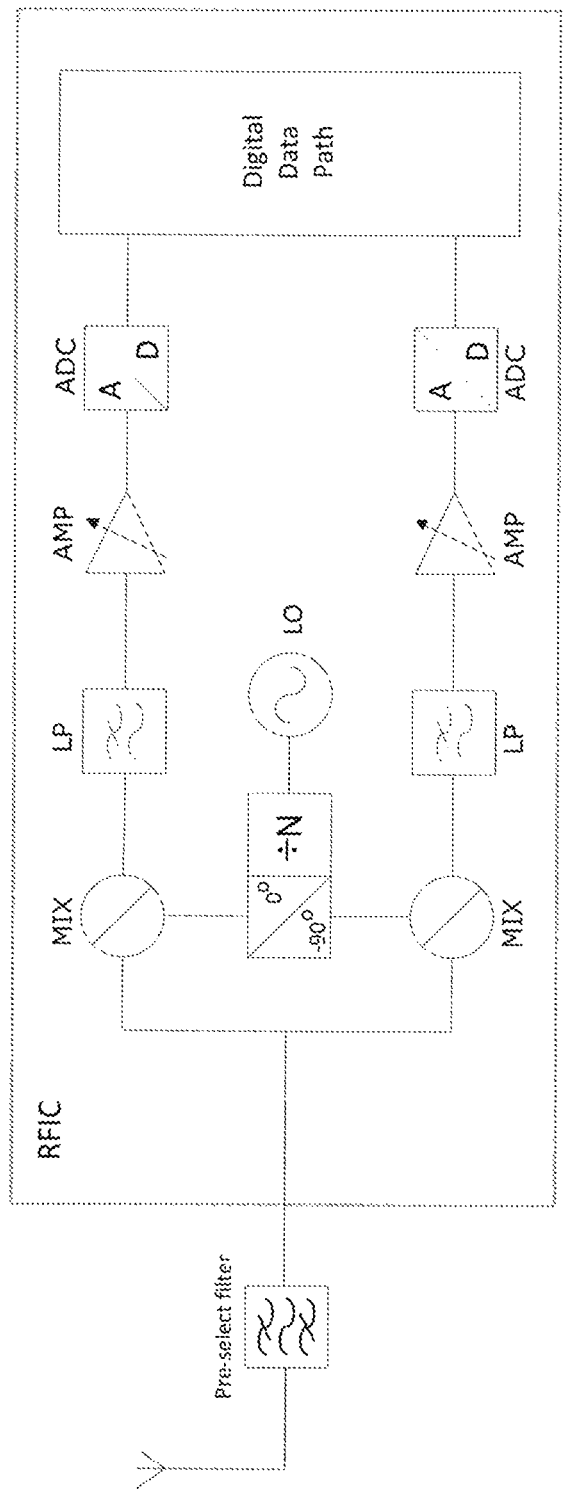
FIG. 2 shows a schematic diagram of an example topology of a mixer-first receiver architecture, for which embodiments of the present invention are applicable.
Figure 3:
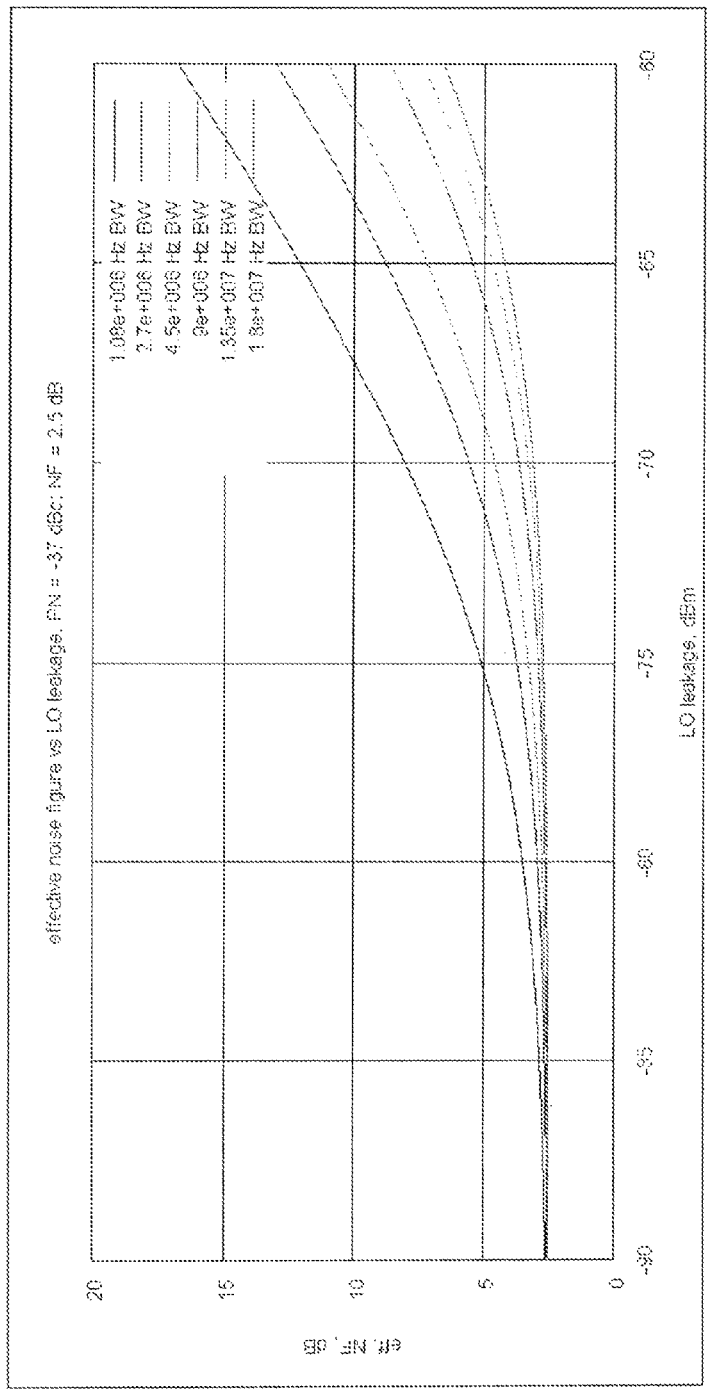
FIG. 3 shows a graph illustrating a receiver noise figure over LO leakage in a mixer-first receiver architecture.

The thus illustrated apparatus according to embodiments of the present invention is dedicated for use at a radio receiver, e.g. a radio receiver of a cellular handset, a radar equipment, a satellite equipment, or the like, but is independent of the technical realization of the receiver part or the receiver. Namely, the thus illustrated apparatus according to embodiments of the present invention is equally applicable to any receiver architectures such as e.g. direct conversion and mixer-first (LNA-less) receiver architectures. For example, the frequency converter according to FIG. 4 may comprise the two mixers (and potentially the associated LO divider) according to FIG. 1 or the four mixers (and potentially the associated wide range frequency dividers) according to FIG. 2.

The thus illustrated frequency converter according to embodiments of the present invention may comprise a mixing portion. The non-DC component of the output signal of the frequency converter may result from a mixing product of the amplitude-modulated local oscillator (LO) signal of the frequency converter with a leakage signal component of the amplitude-modulated local oscillator (LO) signal, which appears at the input of the frequency converter.

The thus illustrated controller apparatus according to embodiments of the present invention may comprise at least one processor and at least one memory, thus representing a processing system with corresponding functionality as explained herein.

In the following, for the sake of clarity and simplicity, various topologies and functions according to embodiments of the present invention are explained with reference to a mixer-first (LNA-less) receiver architecture with two mixers in the frequency converter, i.e. a 2-phase LO frequency converter, by way of example only, yet without restricting applicability of exemplary embodiments of the present invention to such receiver architecture. As mentioned above, it is noted that embodiments of the present invention are equally applicable to direct-conversion receiver architecture and/or mixer-first (LNA-less) receiver architecture with 4, 8, 16, ... mixers in the frequency converter, i.e. a 4-, 8-, 16-, ... -phase LO frequency converter, for example.

Figure 5:
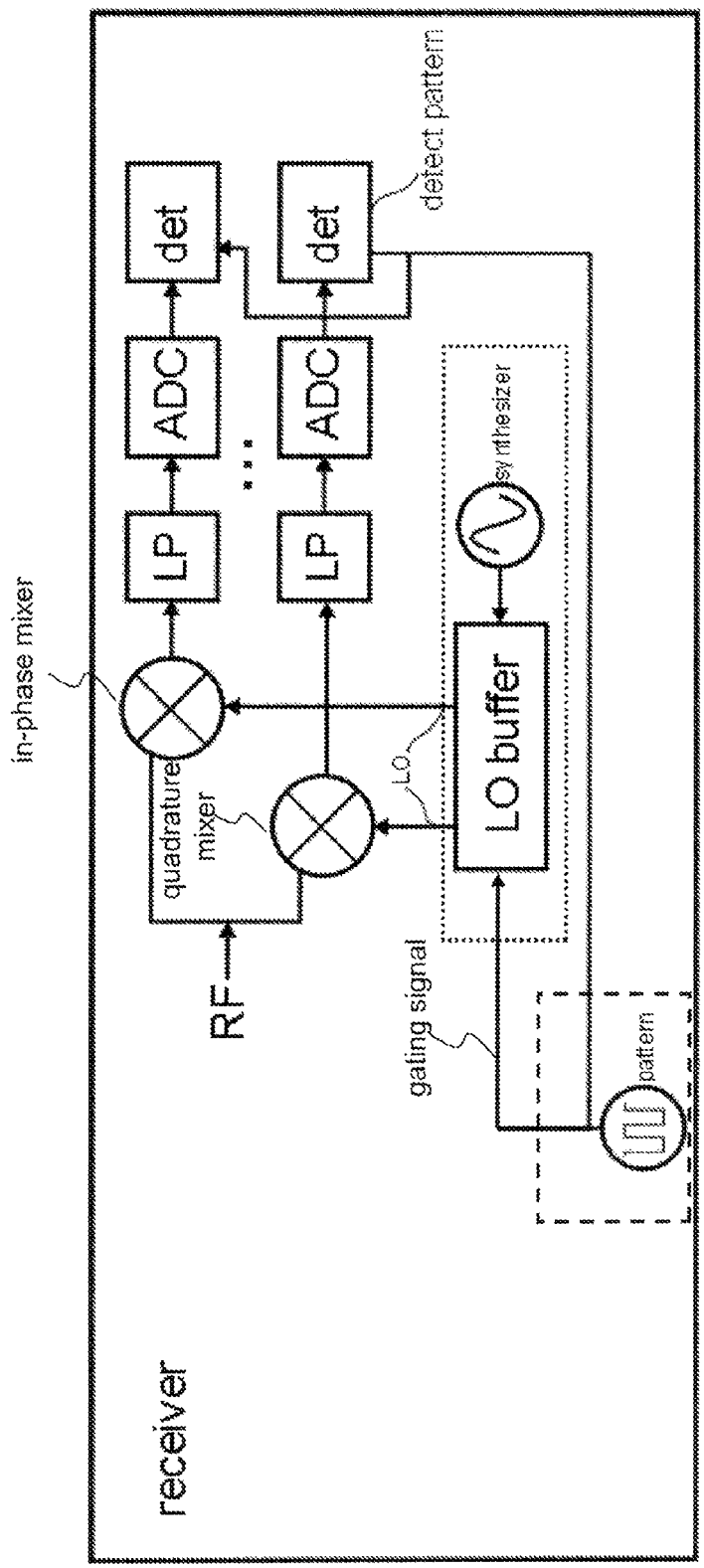
FIG. 5 shows a schematic diagram of a first example topology of a mixer-first receiver architecture according to embodiments of the present invention.
Figure 6:
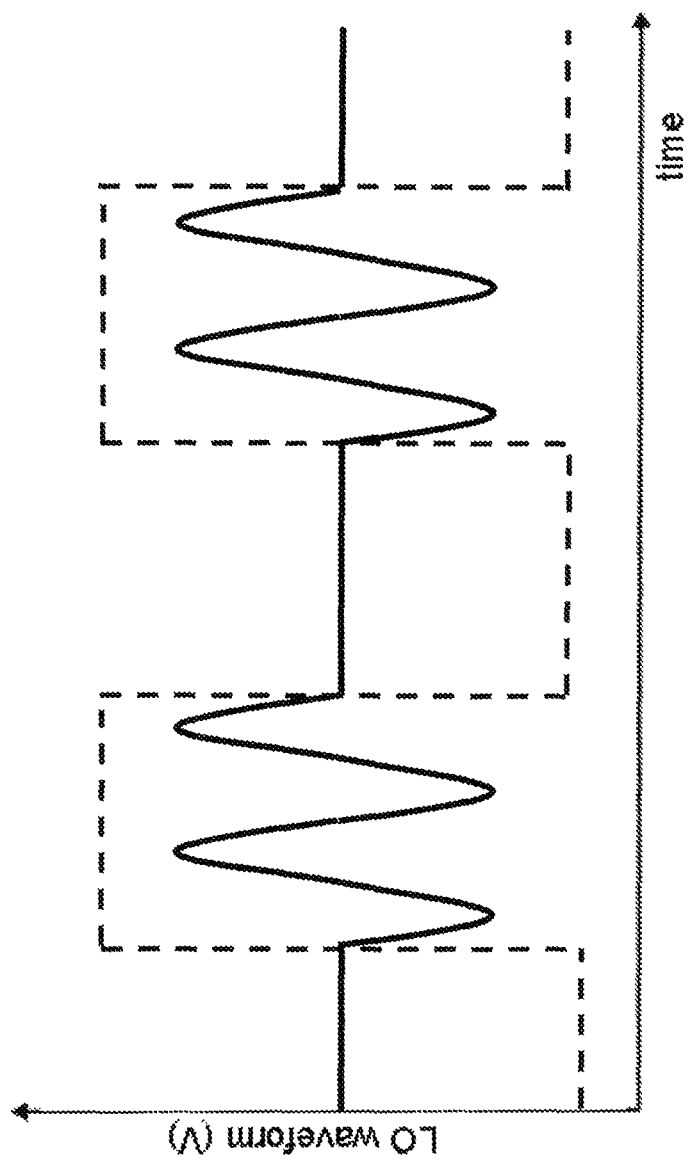
FIG. 6 shows a diagram of a waveform of an amplitude-modulated local oscillator signal according to embodiments of the present invention.

It is noted that the example topologies illustrated in FIGS. 5 and 6 are meant as illustrative example for explanatory purposes only, while (real-world) implementations of the thus exemplified topologies can be more complex by comprising additional elements (such as for example different frontend configurations with RF filters or balancing/matching units). Namely, only those elements are illustrated in the respective topologies, which directly relate to or are associated with embodiments of the present invention.

FIG. 5 shows a schematic diagram of a first example topology of a mixer-first receiver architecture according to embodiments of the present invention. It is noted that all elements except for the signal source (denoted by RF) may be implemented on a RFIC, modem chipset, or the like.

As shown in FIG. 5, at the input of a frequency converter (exemplified by way of an in-phase mixer and a quadrature mixer and their associated LO inputs), a radio signal received via a signal source denoted by RF, which may e.g. comprise an antenna and a RF filter (such as a duplexer, a balun, or the like), is input to the frequency converter. The LO inputs of the mixers are connected to a LO divider or buffer which performs a phase shifting of a LO source signal (from a (double-frequency) synthesizer) so as to generate the LO signals for the in-phase mixer and the quadrature mixer. At the output of the frequency converter, i.e. in each output branch corresponding to the two mixers, an output signal is subject to low-pass (LP) filtering and A/D conversion, before being eventually output to a digital data path or the like. The output signal may contain DC components resulting from static offsets in the frequency converter and/or self-mixing effects (as explained below) and/or second-order linearity (IIP2) effects (i.e. unwanted rectifications of a large received signal or transmit leakage).

In a calibration period, the LO signal(s) generated by the LO divider or buffer is, i.e. the two LO signals are, amplitude-modulated under the control of a controller (indicated by a dashed box). Accordingly, the amplitude-modulated LO signal is applied to the LO input of the frequency converter (or the LO inputs of its mixers), and a LO leakage signal of the amplitude-modulated LO signal results at the RF/signal input of the frequency converter (or the RF/signal inputs of its mixers). The LO leakage signal is processed as outlined above for the received radio signal, thus resulting in a self-mixing product in the output signal of the frequency converter. In addition thereto, the LO leakage signal, i.e. the self-mixing product, is subject to a detection/measurement of non-DC component at a given non-DC frequency at the output of the frequency converter by a detector (det) in each output branch, respectively. The detected/measured non-DC components from the detectors are provided to the controller (not shown) which observes (or estimates) a magnitude of LO leakage of the frequency converter based thereon, and adjusts one or more parameters relating to the frequency converter such that the observed (or estimated) magnitude of LO leakage is reduced.

In the example topology according to FIG. 5, the LO divider or buffer (together with the (double-frequency) synthesizer) serves as a local oscillator generator according to embodiments of the present invention (as indicated by a dotted box). Namely, the (double-frequency) synthesizer serves as a local oscillator source arranged to generate an original local oscillator signal, and the LO divider or buffer serves as an amplitude modulator arranged to perform a gating control on the original local oscillator signal, wherein the gating control is performed in accordance with a waveform pattern provided by the controller (e.g. a sine or rectangular wave). Accordingly, the controller controls the amplitude modulation by the local oscillator signal generator with such waveform pattern.

The waveform pattern may be of a predetermined frequency, for example the frequency of a sine wave, or the fundamental frequency of a rectangular wave. Further, the waveform pattern could also be represented by a bit sequence, such as a pseudo-random bit sequence, and a self-mixing product at the output of the frequency converter could be detected by correlating an output signal of the frequency converter with the bit sequence.

By way of a calibration operation on the basis of such a waveform pattern, a coherent detection of the self-mixing product at the output of the frequency converter may be effected (e.g. by multiplication with the test/switching pattern and integration, with the possibility of increasing the accuracy by increasing the integration time).

FIG. 6 shows a diagram of a waveform of an amplitude-modulated local oscillator signal according to embodiments of the present invention.

In FIG. 6, an example waveform pattern of the controller, which is exemplified as a rectangular waveform here, is depicted by a dashed line, and an example LO signal resulting from the amplitude modulation by the local oscillator generator according to FIG. 5 is depicted by a solid line. It is evident that the LO signal, i.e. the original LO signal exemplified as a sine waveform, is switched on/off in accordance with the (frequency of the) control waveform pattern.

As can be seen in FIG. 6, according to embodiments of the present invention, the frequency of the (original) LO signal is higher than the frequency of the control waveform. It is noted that the logic of switching on/off the (original) LO signal is exemplarily illustrated such that the (original) LO signal is switched on when the control waveform is at a high level, while the switching logic is not restricted to such an illustrative example, but e.g. the (original) LO signal could equally be switched on when the control waveform is at a low level.

According to embodiments of the present invention, as exemplified with reference to FIG. 5, an amplitude modulation (component) of a local oscillator signal may be realized/created using a waveform pattern (such as a test or switching pattern) by gating (i.e. switching on/off) the local oscillator signal with said waveform pattern. Such realization/creation of an amplitude modulation (component) of the local oscillator signal can be easily implemented while resulting in a different local oscillator signal as compared to a normal operation (in a period other than the calibration period). Therefore, while calibration results on the basis of such amplitude modulation may be expected to be somewhat inaccurate, they are assumed to be still good enough for (significantly) reducing local oscillator leakage of the frequency converter.

Figure 7:
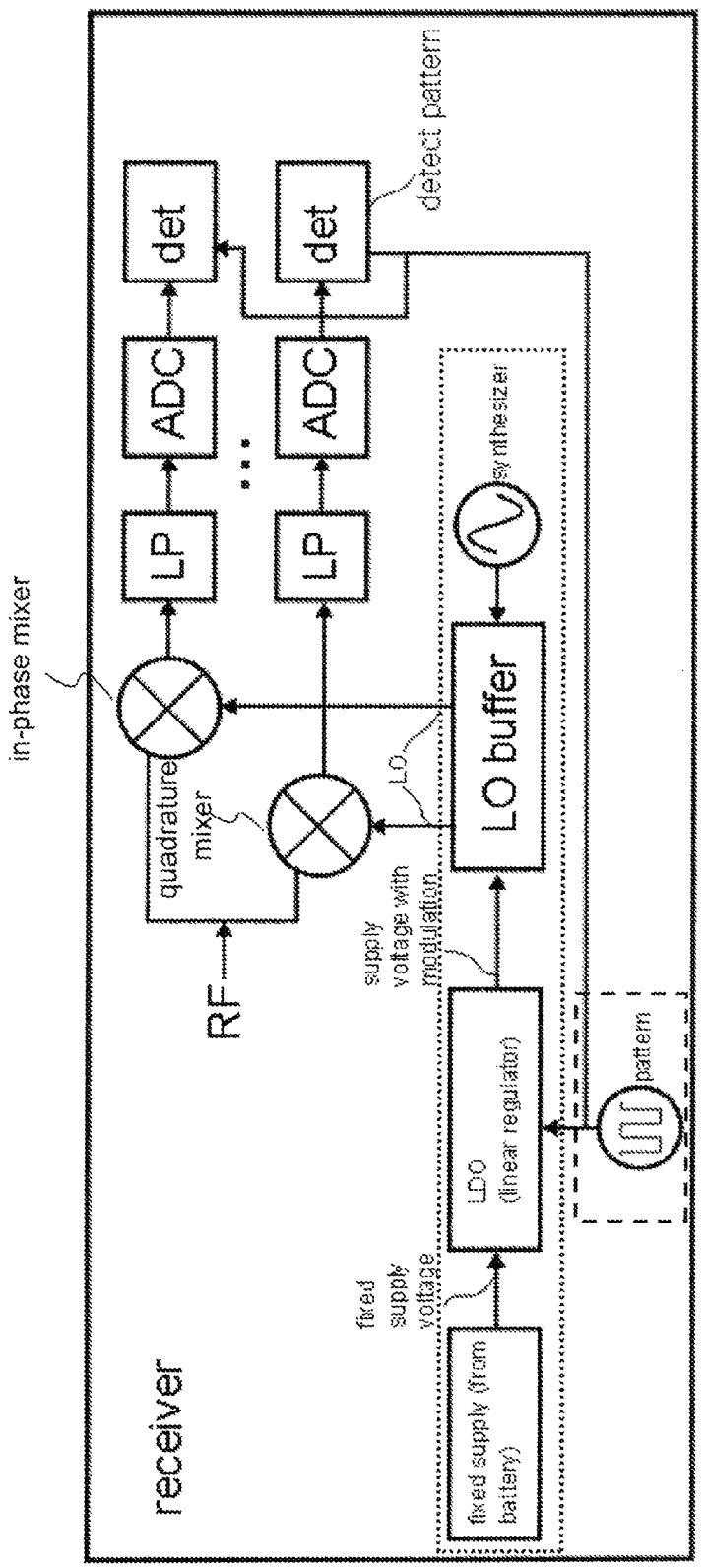
FIG. 7 shows a schematic diagram of a second example topology of a mixer-first receiver architecture according to embodiments of the present invention.

FIG. 7 shows a schematic diagram of a second example topology of a mixer-first receiver architecture according to embodiments of the present invention.

As shown in FIG. 7, the basic configuration is similar to that shown in FIG. 5. Accordingly, reference is made to the above description of FIG. 5 in terms of the structures and normal/calibration operations of the present receiver architecture.

In the example topology according to FIG. 7, the LO divider or buffer (together with the (double-frequency) synthesizer), a linear voltage regulator (LDO) and a fixed supply (such as/from a battery) serve as a local oscillator generator according to embodiments of the present invention (as indicated by a dotted box). Namely, the (double-frequency) synthesizer serves as a local oscillator source arranged to generate an original local oscillator signal, the linear voltage regulator (together with the fixed supply) serves as a modulation signal generator arranged to generate an amplitude modulation signal in accordance with a waveform pattern provided by the controller (e.g. a sine or rectangular wave), and the LO divider or buffer serves as an amplitude modulator arranged to perform an amplitude control on the original local oscillator signal on the basis of the amplitude modulation signal from the modulation signal generator. Accordingly, the controller controls the amplitude modulation by the local oscillator signal generator with such a waveform pattern.

In the example topology according to FIG. 7, the modulation signal generator according to embodiments of the present invention comprises a fixed voltage supply arranged to supply a fixed direct-current voltage, and a linear voltage regulator arranged to perform an amplitude control on the fixed direct-current voltage in accordance with the waveform pattern provided by the controller (e.g. a sine or rectangular wave or a bit sequence) to generate an amplitude-modulated supply voltage of a local oscillator divider or buffer serving as the amplitude modulator. It is noted that the modulation signal generator according to embodiments of the present invention may be any modulated voltage source and may have a different configuration, as long as it is capable of generating an amplitude modulation signal that causes a self-mixing product of an amplitude-modulated LO signal, which can be detected at an output of the frequency converter. In this regard, it is also noted that the LDO exemplified in FIG. 7 represents only an example of a linear voltage regulator which is capable of serving as (part of) a modulation signal generator according to embodiments of the present invention.

Figure 8:
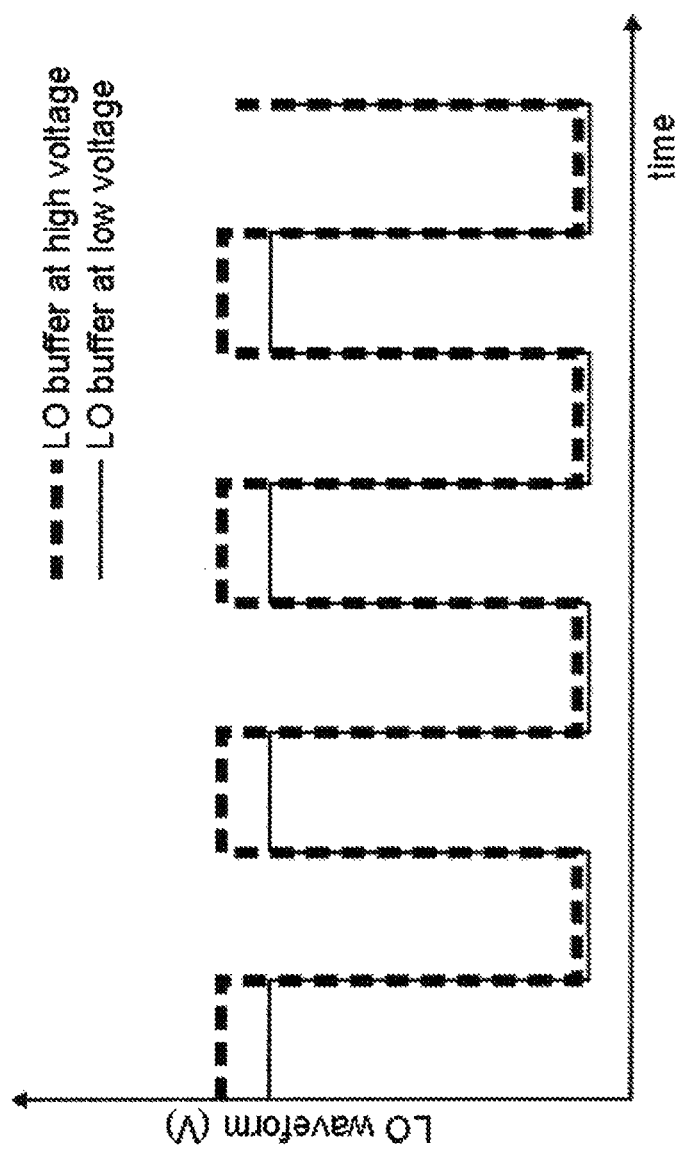
FIG. 8 shows a diagram of waveforms of an amplitude-modulated local oscillator signal for two LO buffer supply voltages according to embodiments of the present invention.

FIG. 8 shows a diagram of waveforms of an amplitude-modulated local oscillator signal for two LO buffer supply voltages according to embodiments of the present invention.

In FIG. 8, two example LO signals resulting from the amplitude modulation by the local oscillator generator according to FIG. 7 are depicted by solid and dashed lines, respectively. It is evident that the LO signal, i.e. the original LO signal (which is assumed to be a rectangular waveform) is modulated in its amplitude in accordance with the (amplitude of the) buffer supply voltage (i.e. the amplitude modulation signal supplied by the linear voltage regulator according to FIG. 5). The buffer supply voltage as such is modulated in accordance with the (frequency of the) control waveform pattern. For example, assuming that the controller provides a rectangular waveform pattern, the buffer supply voltage adopts a first, e.g. high, (maximum) voltage value in a first period of the waveform pattern (e.g. where the waveform pattern is above a predetermined threshold/reference value such as zero), resulting in a LO waveform as exemplified by the dashed line, and the buffer supply voltage adopts a second, e.g. low, (maximum) voltage value in a second period of the waveform pattern (e.g. where the waveform pattern is equal to or below the predetermined threshold/reference value such as zero), resulting in a LO waveform as exemplified by the solid line.

According to embodiments of the present invention, as exemplified with reference to FIG. 7, an amplitude modulation (component) of a local oscillator signal may be realized/created using a waveform pattern (such as a test or switching pattern) by controlling a linear voltage regulator that feeds an amplitude modulator (e.g. the LO divider or buffer according to FIG. 7), i.e. controlling a supply voltage thereof in terms of its amplitude, with the test pattern with said waveform pattern. Such realization/creation of an amplitude modulation (component) of the local oscillator signal creates a small-signal amplitude modulation that does not change the large-signal operating points and is therefore expected to give more accurate results (compared with for example the gating scheme shown in FIG. 5) in terms of reducing local oscillator leakage of the frequency converter.

As outlined above, the self-mixing product of the amplitude-modulated LO signal (i.e. the self-mixing product resulting from the amplitude-modulated LO signal supplied to the frequency converter, which is exemplarily generated as described above in connection with any one of FIGS. 5 and 7, and its leakage component at the (RF/signal) input of the frequency converter) is detected by way of its non-DC components in the output signal of the frequency converter. A magnitude of LO leakage of the frequency converter is observed (or estimated) based thereon i.e. the LO leakage is detected via the self-mixing product, and one or more parameters relating to the frequency converter are adjusted such that the observed (or estimated) magnitude of LO leakage is reduced. For example, mixer controls may be adjusted using the detection/observation (or estimation) result to minimize LO leakage.

Due to the amplitude modulation of the LO signal, the self-mixing product appears at a non-DC frequency, i.e. a frequency other than the DC frequency. This is due to a shift of the DC level of the LO signal, which is caused by the gating or the amplitude modulation of the original LO signal, as evident from any one of FIGS. 6 and 8. Namely, the (e.g. test or switching) waveform pattern of the controller can be a sine or rectangular wave with a sufficiently high frequency to move the LO leakage to a non-DC frequency. The waveform pattern of the controller can also be a bit pattern, which spreads the LO leakage at the output of the frequency converter over a sufficiently wide spectrum to higher, non-DC frequencies.

It is noted that a "non-DC frequency" is a frequency other than a "DC frequency" which may refer for example to a frequency that is suppressed by a DC-offset compensation scheme of the receiver, or below a corner frequency of a high pass response of the receiver, such as achieved by AC-coupling an output signal of the frequency converter.

The LO signals may be AC-coupled to the LO inputs of the frequency converter (i.e. its mixers). Therefore, the DC level at the (RF/signal) input of the frequency converter, i.e. its mixer/s, is fixed, regardless of the average value, i.e. the DC level, of the LO signal. Further, any change in the DC level at the LO divider or buffer does not reach the (LO input of the) frequency converter, i.e. its mixer/s, due to the AC coupling. As the frequency or frequency range of the waveform pattern of the controller is small compared to the LO frequency (~100 kHz vs. 1 GHz), transients from pattern switching edges will be rejected as well.

The self-mixing product results from predetermined properties of the amplitude modulation (e.g. the frequency of the waveform pattern of the controller, or the bit pattern), is known to the controller and can therefore be predicted and detected accurately, for example by correlating an output signal of the frequency converter against a predicted self-mixing product. For example, for a sine wave amplitude modulation signal, the predicted self-mixing product may be a sine wave at a frequency of the sine wave. For a square wave, the predicted self-mixing product may be a square wave or a sine wave (which is a spectral component of a square wave). For an amplitude modulation signal using a pseudo-random bit pattern, a predicted self-mixing product may be the bit pattern itself. Accordingly, the non-DC components in the output signal of the frequency converter can be detected with high accuracy, which may be further improved by increasing the integration time of the measurement or observation (or estimation) as needed.

According to embodiments of the present invention, the calibration may be effected during a normal operation of the apparatus, e.g. the receiver exemplified in any one of FIGS. 5 and 7, or during non-operation thereof (e.g. in a standby, power-up, etc. period).

For the first case of a calibration period during a normal operation period, the controller is arranged to execute calibration (i.e. amplitude modulation control, magnitude observation and parameter adjustment) when the input signal is connected to the input of the frequency converter. In such a case, as the actually received input signal is to be properly processed in parallel to the LO leakage calibration, the non-DC components to be detected for the LO leakage calibration are to be separate from the signal components of the actually received input signal to enable a proper detection for both purposes. To this end, a predetermined frequency of the waveform pattern of the controller may for example be a (e.g. square) wave with a (fundamental) frequency equal to a channel spacing of a communication scheme by which the input signal is carried (which channel spacing depends on the underlying communication system). Thereby, the LO leakage may be moved to the guard band between channels, where received signals are expected to contain only low power, and the modulated LO leakage causes no immediate degradation to normal signal reception. That is, when the LO leakage is modulated to a non-channel frequency (spectrum) such as a guard band of a radio channel, its resulting non-DC components can be detected without interfering with a normal operation of the subject apparatus or receiver.

For the second case of a calibration period during a period other than a normal operation period, i.e. a specific calibration period, the controller is arranged to disconnect the input signal from the input of the frequency converter, to execute calibration (i.e. amplitude modulation control, magnitude observation and parameter adjustment) when the input signal is disconnected from the input of the frequency converter, and to reconnect the input signal to the input of the frequency converter thereafter, i.e. after completion of the calibration). In such a case, as the actually received input signal is not required to be properly processed in parallel to the LO leakage calibration, the non-DC components to be detected for the LO leakage calibration may be located at any desirable frequency (spectrum) irrespective of the frequency properties of a radio signal and/or an underlying communication scheme or system. Accordingly, the waveform pattern of the controller may be a (e.g. square) wave with any conceivable (fundamental) frequency which is suitable for the amplitude modulation as such. For example, the waveform pattern of the controller may be a (e.g. square) wave with a (fundamental) frequency equal to a channel spacing of a communication scheme by which the input signal is carried (which channel spacing depends on the underlying communication system), a frequency larger than one third of a channel bandwidth of a communication scheme by which the input signal is carried (which channel bandwidth depends on the underlying communication system and/or a receiver implementation), or any other frequency. Using a frequency of more than one third of the channel bandwidth is effective for making detection easier and/or more accurate, since harmonics may be rejected by the receiver when using such frequency.

Generally, the subject apparatus or receiver, i.e. the controller thereof, may perform occasional re-/calibration, i.e. with a predetermined timing (e.g. periodically), or when required or desired, i.e. upon determination of a requirement for re-/calibration. Although not restricted thereto, it may be beneficial to perform re-/calibration during normal operation in an occasional/timing-based manner, and to perform re-/calibration outside normal operation in a requirement/desire-based manner (so as to disrupt normal operation only when expedient).

For performing such disruption of normal operation only when expedient, the controller may determine a requirement (or desire) of calibration (i.e. amplitude modulation control, magnitude observation and parameter adjustment) on the basis of the observed magnitude of LO leakage. Namely, the controller may check for the presence of strong LO leakage that would require a re-/calibration, e.g. when the observed LO leakage exceeds a predetermined threshold, environmental conditions change in a predetermined manner, or the like. That is, re-/calibration may be initiated and performed (and the input signal may be disconnected) only when such requirement (or desire) is determined.

Generally, referring to the example topologies according to FIGS. 5 and 7, the self-mixing product results from one or more of a self-mixing between an in-phase LO signal and leakage of itself to the mixer input, a self-mixing between a quadrature LO signal and leakage of itself to the mixer input, self-mixing between an in-phase LO signal and leakage of a quadrature LO signal in combination with some phase shift, e.g. reflection at antenna, and self-mixing between a quadrature LO signal and leakage of an in-phase LO signal in combination with some phase shift, e.g. reflection at antenna.

Hence, parameter/s could be adjusted accordingly, which influence/s the LO leakage and the resulting non-DC components such that the observed (or estimated) magnitude of LO leakage is reduced. Such parameters may be any one of those of the in-phase mixer or a coupling element thereof to the LO divider or buffer, those of the quadrature mixer or a coupling element thereof to the LO divider or buffer, and/or those of the LO divider or buffer (e.g. a duty cycle for each divider output). In particular, such parameters may be any one of a static DC offset at the in-phase mixer (with absence of an LO signal, thus not affecting LO leakage), a static DC offset at the quadrature mixer (with absence of an LO signal, thus not affecting LO leakage), an imbalance at the in-phase mixer (affecting LO leakage on the in-phase branch), an imbalance at the quadrature mixer (affecting LO leakage on the quadrature branch), a static DC offset at the in-phase mixer (with presence of an LO signal), and a static DC offset at the quadrature mixer (with presence of an LO signal). The latter parameters, i.e. the static DC offsets with presence of an LO signal, are particularly relevant, if it turns out that the presence of an LO signal alone causes LO leakage to change, and may thus be regarded as "large signal" static DC offsets as compared with "small signal" static DC offsets with absence of an LO signal.

In view of the aforementioned parameters, a parameter adjustment according to embodiments of the present invention may be effected in various ways. As one example, a set number of measurements equal to the number of parameters may be performed, and a linear equation system for the parameters, i.e. in the same number of variables, may be solved. As another example, more measurements than the number of parameters may be performed, and parameters may be found using a least-square solution to an equation system in the number of variables, that relates parameters to measurement results.

In view of the above, various procedures according to embodiments of the present invention may be implemented, i.e. realized by way of corresponding control operations by the controller.

Figure 9:
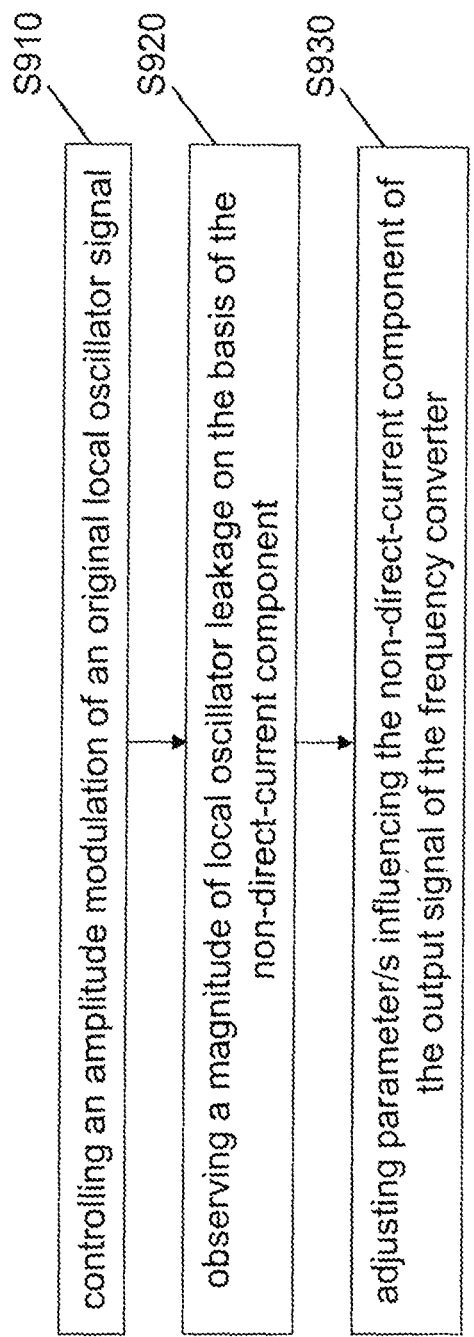
FIG. 9 shows a flowchart of a first example procedure according to embodiments of the present invention.

FIG. 9 shows a flowchart of a first example procedure according to embodiments of the present invention.

As shown in FIG. 9, a procedure according to embodiments of the present invention comprises an operation (S910) of controlling an amplitude modulation of an original local oscillator signal, an operation (S920) of observing (or estimating) a magnitude of local oscillator leakage on the basis of a non-direct-current component of an output signal of a frequency converter, and an operation (S930) of adjusting at least one parameter influencing the non-direct-current component of the output signal of the frequency converter such that the observed (or estimated) magnitude of local oscillator leakage is reduced.

According to embodiments of the present invention, the amplitude modulation or the control thereof in operation S930 may comprise generating the original local oscillator signal and performing a gating control on the original local oscillator signal in accordance with a waveform pattern, or may comprise generating the original local oscillator signal, generating an amplitude modulation signal in accordance with a waveform pattern and performing an amplitude control on the original local oscillator signal on the basis of the amplitude modulation signal. Further, the amplitude modulation signal may be generated by supplying a fixed direct-current voltage and performing an amplitude control on the fixed direct-current voltage in accordance with the waveform pattern to generate an amplitude-modulated supply voltage of a local oscillator divider and/or buffer for generating the amplitude modulation signal.

Figure 10:
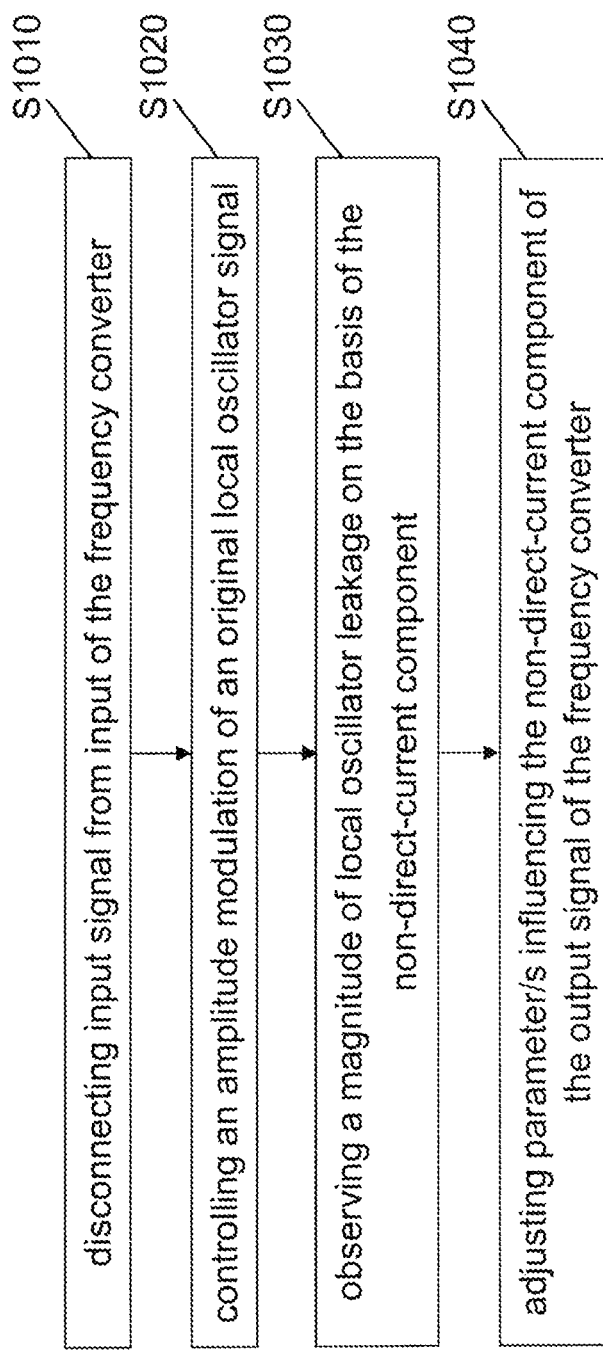
FIG. 10 shows a flowchart of a second example procedure according to embodiments of the present invention.

FIG. 10 shows a flowchart of a second example procedure according to embodiments of the present invention.

As shown in FIG. 10, a procedure according to embodiments of the present invention comprises, in addition to the operations of the procedure according to FIG. 9 (i.e. the operations S1020, S1030 and S1040 correspond to the operations S910, S920 and S930, respectively), an operation (S1010) of disconnecting an input signal from the input of the frequency converter. Namely, the calibration of the frequency converter may be performed outside normal operation of the frequency converter (or an apparatus or receiver comprising the frequency converter), as described above. In this regard, it is noted that the input signal is to be disconnected at least for detection of the non-direct-current component of the output signal of the frequency converter, while the input signal may still be connected and/or again be reconnected during preparation of the local oscillator signal (i.e. before the amplitude-modulated local oscillator signal is supplied to the frequency converter), e.g. during the operation S1020, during processing of the detection result by the controller (i.e. after detection of the non-direct-current component, e.g. during the operation S1030, and during parameter adjustment, e.g. during the operation S1040.

Figure 11:
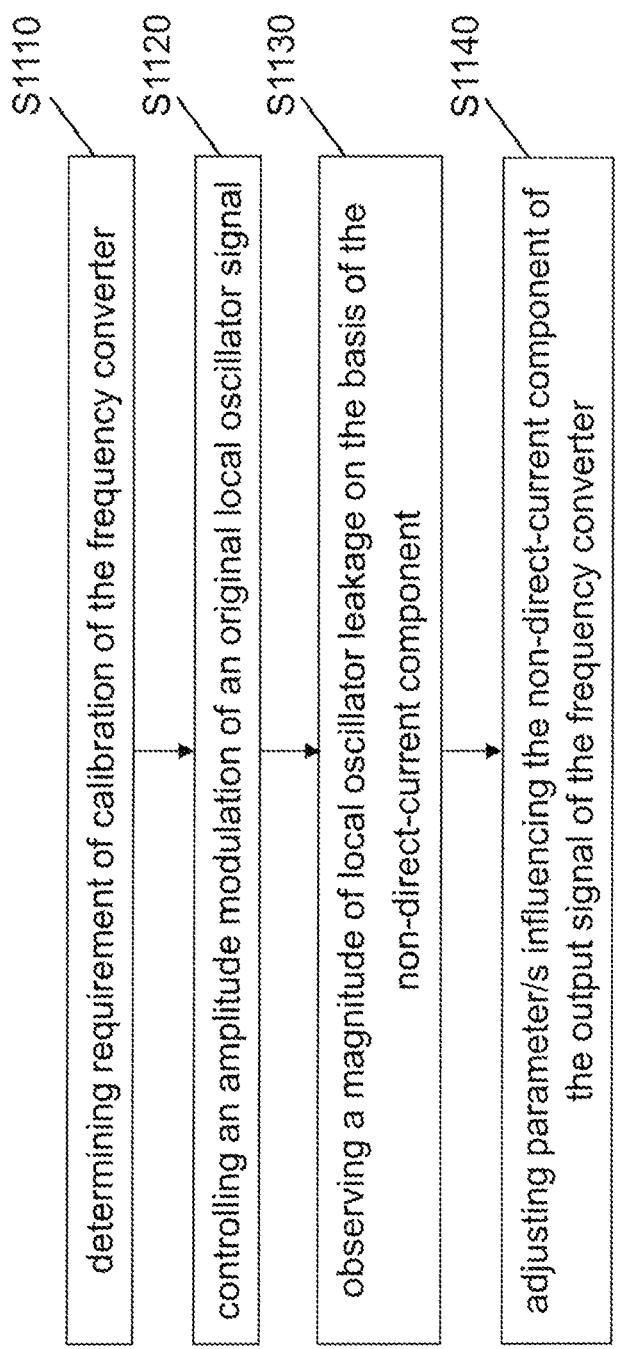
FIG. 11 shows a flowchart of a third example procedure according to embodiments of the present invention.

FIG. 11 shows a flowchart of a third example procedure according to embodiments of the present invention.

As shown in FIG. 11, a procedure according to embodiments of the present invention comprises, in addition to the operations of the procedure according to FIG. 9 (i.e. the operations S1120, S1130 and S1140 correspond to the operations S910, S920 and S930, respectively), an operation (S1110) of determining a requirement of calibration (i.e. amplitude modulation control, magnitude observation and parameter adjustment) on the basis of the observed magnitude of LO leakage. In such case, the operations for calibration, i.e. the operations S1120, S1130 and S1140, are only executed when such requirement is affirmatively determined. Otherwise, the determination operation S1110 is repeated as long as an affirmative determination is made.

In addition or as an alternative to the requirement determination operation S1110, a procedure according to embodiments of the present invention may comprise an operation of performing a timing control, i.e. verifying a predetermined timing, for executing the operations for calibration, i.e. the operations S1120, S1130 and S1140. That is, the operations for calibration may be performed only with a predetermined timing (e.g. every hour) or with a predetermined timing but only when a calibration requirement is present at that time.

By virtue of embodiments of the present invention, as explained above, there is provided techniques for calibration of a frequency converter for reducing a local oscillator leakage of the frequency converter, thus achieving enhancements and/or improvements in terms of leakage calibration for a frequency converter. Thereby, LO leakage as well as second order linearity (IIP2) can be improved for a thus calibrated frequency converter, and any leakage-based performance degradation of the frequency converter (or the receiver or receiver part including the same) can be reduced.

The calibration techniques according to embodiments of the present invention are based on the provision of an amplitude-modulated local oscillator signal, i.e. the realization/creation of an amplitude modulation (component) of the local oscillator signal, and a parameter adjustment on the basis of an observed (or estimated) magnitude of local oscillator leakage in an output signal of the frequency converter with application of such amplitude-modulated local oscillator signal, i.e. a self-mixing product at a non-direct-current frequency. By the amplitude modulation of the local oscillator signal, i.e. a timely variation of the amplitude of the local oscillator signal, the self-mixing product of LO leakage at the output of the frequency converter can be moved to a non-direct-current frequency and thus be detected accordingly.

Accordingly, an accurate calibration of a frequency converter is enabled even without a need for directly sensing its own LO leakage and without a need for any modification (e.g. addition of extra hardware) to the analog signal/data path between RF signal input and A/D conversion. Such calibration is effective in that the actual imbalance of the frequency converter, which causes DC offsets at its output, may be fixed (instead of merely adding observed "symptoms" of the LO leakage with opposite sign).

The calibration techniques according to embodiments of the present invention are independent of an actual use of a corresponding apparatus. Accordingly, such calibration can be performed at the production stage by way of on-wafer testing, thus enabling that samples with insufficient performance (which do not allow an acceptable calibration result) can be spotted and sorted out even before packaging.

An apparatus according to embodiments of the present invention is applicable to any radio receiver or any radio receiver part, e.g. a radio receiver (part) of any communication terminal equipment, which is operable e.g. with any carrier/band/diversity combinations, including diversity receiver architectures. Accordingly, embodiments of the present invention are applicable for any recent or future radio system with a single- or multi-carrier transmission scenario.

In general terms, the respective devices/apparatuses (and/or portions thereof) described herein may represent means for performing respective operations and/or exhibiting respective functionalities, and/or the respective devices/apparatuses (and/or portions thereof) may have functions for performing respective operations and/or exhibiting respective functionalities.

In general, it is to be noted that respective functional blocks or elements according to above-described examples can be implemented by any known means, either in hardware and/or software/firmware, respectively, if it is only adapted to perform the described functions of the respective parts.

Generally, any structural means such as a portion or other circuitry of a receiver circuit may refer to one or more of the following: (a) hardware-only circuit implementations (such as implementations in only analog and/or digital circuitry) and (b) combinations of circuits and software (and/or firmware), such as (as applicable): (i) a combination of processor(s) or (ii) portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. Also, it may also cover an implementation of merely a processor (or multiple processors) or portion of a processor and its (or their) accompanying software and/or firmware, any integrated circuit, or the like.

Generally, any procedural step or functionality is suitable to be implemented as software/firmware or by hardware without changing the idea of the present invention. Such software may be software code independent and can be specified using any known or future developed programming language, such as e.g. Java, C++, C, and Assembler, as long as the functionality defined by the method steps is preserved. Such hardware may be hardware type independent and can be implemented using any known or future developed hardware technology or any hybrids of these, such as MOS (Metal Oxide Semiconductor), CMOS (Complementary MOS), BiMOS (Bipolar MOS), BiCMOS (Bipolar CMOS), ECL (Emitter Coupled Logic), TTL (Transistor-Transistor Logic), etc., using for example ASIC (Application Specific IC (Integrated Circuit)) components, FPGA (Field-programmable Gate Arrays) components, CPLD (Complex Programmable Logic Device) components or DSP (Digital Signal Processor) components. A device/apparatus may be represented by a semiconductor chip, a chipset, or a (hardware) module comprising such chip or chipset; this, however, does not exclude the possibility that a functionality of a device/apparatus or module, instead of being hardware implemented, be implemented as software in a (software) module such as a computer program or a computer program product comprising executable software code portions for execution/being run on a processor. A device may be regarded as a device/apparatus or as an assembly of more than one device/apparatus, whether functionally in cooperation with each other or functionally independently of each other but in a same device housing, for example.

Software in the sense of the present description comprises software code as such comprising code means or portions or a computer program or a computer program product for performing the respective functions, as well as software (or a computer program or a computer program product) embodied on a tangible medium such as a computer-readable (storage)

medium having stored thereon a respective data structure or code means/portions or embodied in a signal or in a chip, potentially during processing thereof.

Apparatuses and/or means or portions thereof can be implemented as individual devices, but this does not exclude that they may be implemented in a distributed fashion throughout the system, as long as the functionality of the device is preserved. Such and similar principles are to be considered as known to a skilled person.

The present invention also covers any conceivable combination of functional and structural features described above, and any conceivable combination of nodes, apparatuses, modules or elements described above, as long as the above-described concepts of functional and structural configuration are applicable.

By virtue of embodiments of the present invention, there is provided techniques for calibration of a frequency converter for reducing a leakage-based non-direct-current component at an output of the frequency converter. In an apparatus comprising a frequency converter arranged to perform frequency conversion on an input signal, a local oscillator signal generator arranged to generate an amplitude-modulated local oscillator signal of the frequency converter, and a detector arranged to detect a non-direct-current component of an output signal of the frequency converter, which results from the amplitude-modulated local oscillator signal, an amplitude modulation of an original local oscillator signal by the local oscillator signal generator is controlled, a magnitude of local oscillator leakage of the frequency converter is observed on the basis of the non-direct-current component detected by the detector, and at least one parameter influencing the non-direct-current component of the output signal of the frequency converter is adjusted such that the observed magnitude of local oscillator leakage is reduced.

The above embodiments are to be understood as illustrative examples of the invention. Further embodiments of the invention are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

LIST OF ACRONYMS AND ABBREVIATIONS

3GPP 3$^{rd}$ Generation Partnership Project
ADC Analog-to-Digital Converter
AC Alternating Current
AMP Amplifier
BB Baseband
BW Bandwidth
DC Direct Current
GLONASS Globalnaya Navigatsionnaya Sputnikovaya Sistema
GPS Global Positioning System
IC Integrated Circuit
IF Intermediate Frequency
IIP2 2nd order Input Intercept Point
LDO Low-Dropout Regulator
LO Local Oscillator
LNA Low Noise Amplifier
LP Low Pass (Filter)
LTE Long Term Evolution
MIX Mixer
NF Noise Figure/Factor
PN Phase Noise
RF Radio Frequency
RFIC Radio Frequency Integrated Circuit
WLAN Wireless Local Area Network

We claim:

1. An apparatus for use at a radio receiver, the apparatus comprising:
a frequency converter arranged to perform frequency conversion on an input signal;
a local oscillator signal generator arranged to generate an amplitude-modulated local oscillator signal of the frequency converter;
a detector arranged to detect a non-direct-current component of an output signal of the frequency converter; and
a controller arranged to:
control an amplitude modulation of an original local oscillator signal by the local oscillator signal generator,
observe a magnitude of local oscillator leakage of the frequency converter on the basis of the non-direct-current component detected by the detector, and
adjust at least one parameter influencing the non-direct-current component of the output signal of the frequency converter such that the observed magnitude of local oscillator leakage is reduced.

2. The apparatus according to claim 1, wherein:
the frequency converter comprises a mixing portion, and
the non-direct-current component of the output signal of the frequency converter results from a mixing product of the amplitude-modulated local oscillator signal of the frequency converter with a leakage signal component of the amplitude-modulated local oscillator signal which appears at the input of the frequency converter.

3. The apparatus according to claim 1, wherein:
the controller is arranged to control the amplitude modulation by the local oscillator signal generator with a waveform pattern, and
the local oscillator signal generator comprises:
a local oscillator source arranged to generate the original local oscillator signal, and
an amplitude modulator arranged to perform a gating control on the original local oscillator signal in accordance with the waveform pattern.

4. The apparatus according to claim 1, wherein:
the controller is arranged to control the amplitude modulation by the local oscillator signal generator with a waveform pattern, and
the local oscillator signal generator comprises:
a local oscillator source arranged to generate the original local oscillator signal,
a modulation signal generator arranged to generate an amplitude modulation signal in accordance with the waveform pattern, and
an amplitude modulator arranged to perform an amplitude control on the original local oscillator signal on the basis of the amplitude modulation signal.

5. The apparatus according to claim 4, wherein the modulation signal generator comprises:
a fixed voltage supply arranged to supply a fixed direct-current voltage, and
a linear voltage regulator arranged to perform an amplitude control on the fixed direct-current voltage in accordance with the waveform pattern to generate an amplitude-modulated supply voltage of a local oscillator divider and/or buffer serving as the amplitude modulator.

6. The apparatus according to claim 3, wherein:
the waveform pattern is a rectangular or sinusoidal waveform pattern of a predetermined frequency, and/or
the predetermined frequency of the waveform pattern is a frequency equal to a channel spacing of a communication scheme by which the input signal is carried or a frequency larger than one third of a channel bandwidth of a communication scheme by which the input signal is carried.

7. The apparatus according to claim 3, wherein:
the controller is arranged to disconnect the input signal from the input of the frequency converter, execute amplitude modulation control, magnitude observation and parameter adjustment when the input signal is disconnected from the input of the frequency converter, and reconnect the input signal to the input of the frequency converter, or
the controller is arranged to execute amplitude modulation control, magnitude observation and parameter adjustment when the input signal is connected to the input of the frequency converter, when a frequency of the waveform pattern is a frequency equal to a channel spacing of a communication scheme by which the input signal is carried.

8. The method for controlling an apparatus comprising a frequency converter arranged to perform frequency conversion on an input signal, a local oscillator signal generator arranged to generate an amplitude-modulated local oscillator signal of the frequency converter, and a detector arranged to detect a non-direct-current component of an output signal of the frequency converter, said method comprising:
controlling an amplitude modulation of an original local oscillator signal by the local oscillator signal generator;
observing a magnitude of local oscillator leakage of the frequency converter on the basis of the non-direct-current component detected by the detector; and
adjusting at least one parameter influencing the non-direct-current component of the output signal of the frequency converter such that the observed magnitude of local oscillator leakage is reduced.

9. The method according to claim 8, wherein:
the frequency converter comprises a mixing portion, and
the non-direct-current component of the output signal of the frequency converter results from a mixing product of the amplitude-modulated local oscillator signal of the frequency converter with a leakage signal component of the amplitude-modulated local oscillator signal which appears at the input of the frequency converter.

10. The method according to claim 8, wherein the amplitude modulation of the original local oscillator signal comprises:
generating the original local oscillator signal, and
performing a gating control on the original local oscillator signal in accordance with a waveform pattern.

11. The method according to claim 8, wherein the amplitude modulation of the original local oscillator signal comprises:
generating the original local oscillator signal,
generating an amplitude modulation signal in accordance with a waveform pattern, and
performing an amplitude control on the original local oscillator signal on the basis of the amplitude modulation signal.

12. The method according to claim 11, wherein generating the amplitude modulation signal comprises:
supplying a fixed direct-current voltage, and
performing an amplitude control on the fixed direct-current voltage in accordance with the waveform pattern to generate an amplitude-modulated supply voltage of a local oscillator divider and/or buffer for generating the amplitude modulation signal.

13. The method according to claim 10, wherein:
the waveform pattern is a rectangular or sinusoidal waveform pattern of a predetermined frequency, and/or
the predetermined frequency of the waveform pattern is a frequency equal to a channel spacing of a communication scheme by which the input signal is carried or a frequency larger than one third of a channel bandwidth of a communication scheme by which the input signal is carried.

14. The method according to claim 10, wherein:
amplitude modulation control, magnitude observation and parameter adjustment are executed when the input signal is disconnected from the input of the frequency converter, or
amplitude modulation control, magnitude observation and parameter adjustment are executed when the input signal is connected to the input of the frequency converter, when a frequency of the waveform pattern is a frequency equal to a channel spacing of a communication scheme by which the input signal is carried.

15. The method according to claim 8, further comprising:
determining a requirement of amplitude modulation control, magnitude observation and parameter adjustment on the basis of the observed magnitude or with a predetermined timing; and
executing amplitude modulation control, magnitude observation and parameter adjustment on the basis of the determination.

16. The method according to claim 8, wherein:
the frequency converter comprises at least two mixers which are arranged to act with different phases of the amplitude-modulated local oscillator signal of the frequency converter,
the output of the frequency converter comprises one output for each mixer, and
the non-direct-current component of an output signal is detected at each output of the frequency converter.

17. The method according to claim 8, wherein:
the frequency converter comprises two mixers, one of which being arranged to act as an in-phase mixer and the other one of which being arranged to act as a quadrature mixer,
the output of the frequency converter comprises an in-phase output and a quadrature output, and
the non-direct-current component of an output signal is detected at the in-phase output and the quadrature output of the frequency converter.

18. The method according to claim 16, wherein the at least one parameter comprises one or more of:
a static direct current offset of anyone of the mixers with absence of the amplitude-modulated local oscillator signal, a static direct current offset of anyone of the mixers with presence of the amplitude-modulated local oscillator signal, or
an imbalance at anyone of the mixers.

19. The method according to claim 8, wherein the apparatus is operable for a receiver of direct conversion type and/or a receiver of a mixer-first architecture.

20. An apparatus comprising:
circuitry configured to
- control an amplitude modulation of a local oscillator signal generated by a local oscillator signal generator and provided to a frequency converter;
- observe a magnitude of local oscillator leakage of the frequency converter based on the non-direct-current component detected by the detector; and
- adjust at least one parameter influencing the non-direct-current component detected in an output signal of the frequency converter such that the observed magnitude of local oscillator leakage is reduced.

* * * * *